United States Patent
Keehn et al.

(10) Patent No.: US 12,382,612 B2
(45) Date of Patent: Aug. 5, 2025

(54) MITIGATING VAPOR LOSS IN A TWO-PHASE IMMERSION COOLING SYSTEM

(71) Applicant: Microsoft Technology Licensing, LLC, Redmond, WA (US)

(72) Inventors: Nicholas Andrew Keehn, Kirkland, WA (US); Ioannis Manousakis, Heraklion (GR); Winston Allen Saunders, Seattle, WA (US); Husam Atallah Alissa, Redmond, WA (US); Eric Clarence Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 42 days.

(21) Appl. No.: 18/396,153

(22) Filed: Dec. 26, 2023

(65) Prior Publication Data

US 2024/0130091 A1    Apr. 18, 2024

Related U.S. Application Data (63) Continuation of application No. 16/549,244, filed on Aug. 23, 2019, now Pat. No. 11,903,172.

(51) Int. Cl.
*H05K 7/20*    (2006.01)

(52) U.S. Cl.
CPC ......... *H05K 7/20818* (2013.01); *H05K 7/203* (2013.01); *H05K 7/20318* (2013.01); *H05K 7/20327* (2013.01); *H05K 7/208* (2013.01)

(58) Field of Classification Search
CPC .............. H05K 7/203; H05K 7/20818; H05K 7/20318; H05K 7/20327; H05K 7/208; A47L 15/486; B01D 5/0027; B01D 53/002

See application file for complete search history.

(56) References Cited

U.S. PATENT DOCUMENTS

| | | | |
|---|---|---|---|
| 5,565,070 A * | 10/1996 | Doi .......................... | B01D 3/00 202/205 |
| 5,769,912 A * | 6/1998 | Mansur ................ | B01D 53/002 134/107 |

(Continued)

FOREIGN PATENT DOCUMENTS

JP    2017183344 A  *  10/2017  ........... H01L 23/473

*Primary Examiner* — Tho V Duong
(74) *Attorney, Agent, or Firm* — Ray Quinney & Nebeker P.C.; Paul N. Taylor (57) ABSTRACT

Techniques for mitigating loss of vaporized working fluid in a two-phase immersion cooling system may be implemented using one or more supplemental condensers that facilitate condensation of vaporized working fluid when the immersion tank is open, and one or more vapor collection points that are in fluid communication with at least one supplemental condenser. One or more fluid displacement devices may be configured to create suction pressure at the one or more vapor collection points. One or more vents may be positioned in the door. The one or more vents may be configured to permit movement of air from outside the immersion tank into an interior portion of the immersion tank without permitting loss of vaporized working fluid. A directional blowing device may be configured to blow a gaseous substance against a computing device in a downward direction as the computing device is being pulled upward out of the immersion tank.

20 Claims, 8 Drawing Sheets

(56) References Cited

U.S. PATENT DOCUMENTS

| | | | |
|---|---|---|---|
| 2015/0382515 A1* | 12/2015 | James | H05K 7/20327 |
| | | | 361/679.47 |
| 2017/0064862 A1* | 3/2017 | Miyoshi | H01L 23/32 |
| 2018/0020570 A1* | 1/2018 | Fujiwara | H05K 7/20318 |
| 2018/0084670 A1* | 3/2018 | Hirai | H05K 7/20272 |
| 2018/0098464 A1* | 4/2018 | Ishinabe | H05K 7/20736 |
| 2019/0014685 A1* | 1/2019 | So | H05K 7/20236 |

* cited by examiner

MITIGATING VAPOR LOSS IN A TWO-PHASE IMMERSION COOLING SYSTEM

CROSS-REFERENCE TO RELATED APPLICATIONS

This application is a continuation of U.S. patent application Ser. No. 16/549,244, filed Aug. 23, 2019, which is incorporated by reference in its entirety.

BACKGROUND

Computer cooling is the process of removing waste heat generated by system components within a computer system to keep components within permissible operating temperature limits. Cooling can be important because computer components are susceptible to temporary malfunction or permanent failure if they are overheated.

A data center is a physical facility that is used to house computer systems and associated components. A data center typically includes a large number of computing devices (e.g., servers), which may be stacked in racks that are placed in rows. A colocation center is a type of data center where equipment, space, and network bandwidth are available for rental to customers.

A data center typically includes a cooling system to enable the computing devices within the data center to continue working within their specified thermal limits. Many computing devices use air for cooling system components requiring data centers to utilize air-based cooling techniques to transfer the heat to the external environment. Air has a low specific heat capacity requiring large amounts of air to remove a watt of heat. Air-based cooling techniques often require expensive infrastructure components such as computer room air conditioning (CRAC) units, air conditioner compressors, air circulation fans, duct work, air handlers, dehumidifiers, and the like.

One of the challenges in managing a data center is achieving the right balance between space and power. For various reasons, power density has increased considerably over the last few years. As server racks become more thermally dense requiring greater quantities of air for cooling, however, the costs and logistics of conventional cooling using air becomes increasingly challenging.

Some data centers utilize immersion cooling techniques in which computing devices are submerged in a thermally conductive, electrically isolating dielectric fluid, which may be referred to as a working fluid or a heat transfer fluid. In an immersion cooling system, at least one container (e.g., a tank) is filled with the working fluid, and computing devices are placed in the container. The container may be referred to herein as an immersion tank. The working fluid has a higher heat capacity than air requiring less fluid volume for a given heat load. Heat is removed from the computing devices by circulating the working fluid into direct contact with hot components, then through heat exchangers where the waste heat is transferred to ultimately be rejected to the external environment. Fluids suitable for immersion cooling have very good insulating properties to ensure that they can safely come into contact with energized electronic components without significantly altering the electrical characteristics of the system or system components. Immersion cooling has the potential to become a popular cooling solution for data centers because it allows operators to drastically reduce their energy usage through the elimination of the air cooling infrastructure.

Broadly speaking, there are two different types of immersion cooling techniques: single-phase immersion cooling and two-phase immersion cooling.

With a single-phase immersion cooling system, the working fluid never changes state and always remains in a liquid form. In some implementations, the working fluid may be actively circulated by pumping the dielectric coolant in, through, and around the computing devices being cooled, and then transferring the heat absorbed by the coolant to a heat rejection device such as a radiator, dry cooler, liquid-to-liquid heat exchanger, or cooling tower. Alternatively, the working fluid may be passively circulated by the natural convection of the heated coolant to the heat rejection device(s).

In a two-phase immersion cooling system, the heat of vaporization and the specific heat capacity characteristics of the work fluid are utilized for cooling. The working fluid generally has a relatively low boiling point such that heat absorbed by the fluid surrounding the computing devices causes a portion of the working fluid to boil off or vaporize into a gas, thereby enabling the phase change of the working fluid to carry heat away from the computing devices. The vapors produced by the boiling of the working fluid rise above the fluid pool where they contact a condenser that is cooler than the working fluid's boiling point. This causes the vapors to condense back into a liquid and fall back into the fluid pool.

To maintain a condenser at a suitable temperature, cool liquid may be pumped through the condenser. Thus, a two-phase immersion cooling system may also include one or more condenser pumps that are configured to pump cool liquid through the condenser(s) in the system.

An immersion tank that is used in connection with a two-phase immersion cooling system generally includes some type of mechanism that allows the immersion tank to be sealed in order to prevent vapors produced by the boiling of the working fluid from escaping out of the immersion tank. For example, an immersion tank may include a door that can be opened and closed, and the door may generally be kept closed during normal operation of the immersion cooling system. From time to time, however, it may be necessary to open the door to gain access to the computing devices within the immersion tank. For example, it may be necessary to remove one or more computing devices from the immersion tank in order to perform maintenance, possibly as part of planned maintenance and/or to replace components that have failed.

When an immersion tank is opened to permit access to the computing devices contained therein, some loss of vaporized working fluid may occur. Much of this loss may be caused by air currents that push the vaporized working fluid outside of the immersion tank. These air currents may be produced in many different ways. As an example, air currents may be produced by the opening of the door to the immersion tank. As another example, air currents may be produced by an air conditioning system in the room in which the cooling system is located.

The loss of vaporized working fluid is undesirable because the working fluid is typically quite expensive. Therefore, a reduction in the amount of lost vaporized working fluid can provide significant cost savings. Accordingly, benefits may be realized by improved techniques for mitigating loss of vaporized working fluid in a two-phase immersion cooling system.

SUMMARY

In accordance with one aspect of the present disclosure, a two-phase immersion cooling system is disclosed that includes an immersion tank that is configured to retain dielectric working fluid and also configured to retain a plurality of computing devices that are submerged in the dielectric working fluid. The two-phase immersion cooling system also includes a supplemental condenser that facilitates condensation of vaporized working fluid when the immersion tank is open. The supplemental condenser is not in fluid communication with an interior portion of the immersion tank when the immersion tank is sealed. The two-phase immersion cooling system also includes a vapor collection point that is in fluid communication with the supplemental condenser. The two-phase immersion cooling system also includes a fluid displacement device that is configured to create suction pressure at the vapor collection point.

In some embodiments, the supplemental condenser may be positioned against a side portion of the immersion tank. In some embodiments, the supplemental condenser may be positioned underneath the immersion tank.

The two-phase immersion cooling system may further include a plurality of supplemental condensers and a plurality of vapor collection points. Each vapor collection point may be in fluid communication with at least one of the plurality of supplemental condensers.

In some embodiments, the vapor collection point may include a rollover vapor collection point that is positioned below an upper edge of the immersion tank. In some embodiments, the vapor collection point may include an above-edge vapor collection point that is positioned at an upper edge of the immersion tank.

The vapor collection point may include a tube. The tube may be positioned within an interior portion of the immersion tank. The tube may be in fluid communication with the supplemental condenser. In some embodiments, the tube may include a flexible section. The two-phase immersion cooling system may further include a floating member that is affixed to the tube.

The immersion tank may include a plurality of vapor collection apertures in a peripheral region of the immersion tank. The plurality of vapor collection apertures may be in fluid communication with the supplemental condenser.

The two-phase immersion cooling system may further include control circuitry. In some embodiments, the control circuitry may be configured to cause a speed of the fluid displacement device to be increased in response to a signal indicating that the immersion tank is going to be opened. In some embodiments, the control circuitry may be configured to cause a speed of a condenser pump to be increased in response to a signal indicating that the immersion tank is going to be opened.

The two-phase immersion cooling system may further include a directional blowing device that is configured to blow a gaseous substance against a computing device in a downward direction as the computing device is being pulled upward out of the immersion tank. The gaseous substance may be heated. In some embodiments, the two-phase immersion cooling system may further include a scooping device positioned underneath the directional blowing device. The scooping device may include a vacuum.

In accordance with another aspect of the present disclosure, an immersion tank for a two-phase immersion cooling system is disclosed that includes a basin that is configured to retain dielectric working fluid and a plurality of computing devices that are submerged in the dielectric working fluid. The immersion tank also includes a door connected to the basin such that closing the door seals the immersion tank and prevents vaporized working fluid from escaping out of the immersion tank. The immersion tank also includes a vent positioned in the door. The vent is configured to permit movement of air from outside the immersion tank into an interior portion of the immersion tank when the door is opened. The vent does not permit the vaporized working fluid to escape out of the immersion tank.

In some embodiments, the vent may be a one-way vent. In some embodiments, the vent may be an actuated vent. The immersion tank may further include an actuator that is configured to open and close the vent.

In accordance with another aspect of the present disclosure, a two-phase immersion cooling system is disclosed that includes a plurality of immersion tanks that are configured to retain dielectric working fluid and a plurality of computing devices that are submerged in the dielectric working fluid. The two-phase immersion cooling system also includes a condenser and an air handling system that carries a mixture of air and vaporized working fluid from the plurality of immersion tanks to the condenser. The two-phase immersion cooling system also includes global fluid reservoir in fluid communication with the condenser and with the plurality of immersion tanks. The two-phase immersion cooling system also includes control circuitry that is configured to cause the dielectric working fluid in the plurality of immersion tanks to be replenished from the global fluid reservoir.

The two-phase immersion cooling system may further include a high-pressure chamber. The condenser may be located in the high-pressure chamber. The air handling system may direct the mixture of the air and the vaporized working fluid into the high-pressure chamber. The two-phase immersion cooling system may further include a fluid displacement device that is located adjacent to the high-pressure chamber.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which.

DETAILED DESCRIPTION

The present disclosure is generally related to techniques for mitigating loss of vaporized working fluid in a two-phase immersion cooling system.

Known two-phase immersion cooling systems typically include a condenser that facilitates condensation of vaporized working fluid. This type of condenser is typically positioned at or near the upper surface of the working fluid, and it is in fluid communication with the interior portion of the immersion tank (i.e., the part that retains the working fluid) when the immersion tank is sealed. The purpose of this type of condenser is to cause the vaporized working fluid to condense back into a liquid. This works well when the immersion tank door is closed. However, this type of condenser does not address the problem of the vaporized working fluid escaping out of the immersion tank when the immersion tank door is opened.

In accordance with one aspect of the present disclosure, a two-phase immersion cooling system may include one or more additional condensers that facilitate the condensation of vaporized working fluid when the immersion tank is open. Such condensers may be referred to herein as supplemental condensers. In some embodiments, supplemental condensers may not be in fluid communication with the interior portion of the immersion tank when the immersion tank is sealed. However, supplemental condensers are able to capture vaporized working fluid when the immersion tank is opened.

In some embodiments, a two-phase immersion cooling system may include a plurality of supplemental condensers. Supplemental condensers may be positioned in various places. For example, one or more supplemental condensers may be positioned against a side portion of the immersion tank. As another example, one or more supplemental condensers may be positioned underneath the immersion tank. Supplemental condensers that are used in connection with a particular immersion tank may be located external to the immersion tank.

Each supplemental condenser may be in fluid communication with a vapor collection point that is positioned at or near the upper edge of the immersion tank. Different types of vapor collection points may be utilized in accordance with the present disclosure. For example, a rollover vapor collection point may be positioned below an upper edge of the immersion tank. Vaporized working fluid is typically heavier than air and will generally roll over the edge of the immersion tank if allowed to do so. Having a vapor collection point located below the vapor level would allow the vaporized working fluid that rolls over the edge of the immersion tank to be collected. In other words, if air currents cause the vaporized working fluid to be pushed over the edge of the immersion tank, much if not all of the vaporized working fluid should sink downward and enter the rollover vapor collection point. From the rollover vapor collection point, the vaporized working fluid can be carried toward a supplemental condenser.

As another example, an above-edge vapor collection point may be positioned above an upper edge of the immersion tank. Such a vapor collection point may be configured to capture vaporized working fluid that is pushed upward out of the immersion tank.

As another example, a vapor collection point may be provided within an interior portion of the immersion tank. Such a vapor collection point may include a tube that is positioned within an interior portion of the immersion tank. The tube may be in fluid communication with a supplemental condenser. Having an interior vapor collection point would allow vaporized working fluid that is at or near the middle of the immersion tank to be collected when the door to the immersion tank is opened. In addition, having an interior vapor collection point may reduce the air currents that are produced when the door to the immersion tank is opened.

In some embodiments, an interior vapor collection point may be located at (or near) a central portion of the immersion tank. In other embodiments, however, an interior vapor collection point may be located within a part of the immersion tank that is off-center. Ideally, an interior vapor collection point should be placed adjacent to the point where bubbles (corresponding to vaporized working fluid) emerge from the working fluid, so that the interior vapor collection point will be in a position to collect the vaporized working fluid before it has a chance to build up extensively.

In some embodiments, a plurality of vapor collection points may be provided within an interior portion of the immersion tank. For example, in an immersion tank that includes multiple columns of processors on a single board, multiple interior vapor collection points may be provided corresponding to the multiple columns of processors.

In some embodiments, the tube may include a flexible section (i.e., a section that can expand or contract, thereby making the section longer or shorter), and a floating member may be affixed to the tube above the flexible section. One benefit of having the floating member and the flexible section is to ensure that the interior vapor collection point stays above the upper surface of the working fluid while maintaining close proximity to the working fluid.

In some embodiments, the immersion tank may include a plurality of vapor collection apertures in a peripheral region of the immersion tank. The vapor collection apertures may be in fluid communication with one or more supplemental condensers. If air currents cause vaporized working fluid to be pushed toward the peripheral region of the immersion tank, at least some of the vaporized working fluid should sink downward (assuming that the vaporized working fluid is heavier than air) and enter a supplemental condenser through the vapor collection apertures.

In some embodiments, the supplemental condensers and the vapor collection apertures may be independent of the immersion tank. In other words, the same supplemental condensers and vapor collection apertures may be designed in such a way that they can be used in connection with more than one type of immersion tank. For example, the supplemental condensers and the vapor collection apertures as disclosed herein may be used in connection with both individual, all-in-one immersion tank designs as well as building-level integrated immersion tank designs. The supplemental condensers and the vapor collection apertures as disclosed herein may also be used in connection with immersion tanks that use different pressure equalization methods. In some embodiments, a single supplemental condenser may be used in connection with a plurality of different immersion tanks.

In some embodiments, the cooling system may include a sump into which the condensed working fluid can drain. The force of gravity causes the condensed working fluid to flow downward into the sump. The condensed working fluid can then be pumped back into the immersion tank (or into a different immersion tank) and reused.

Figure 1:
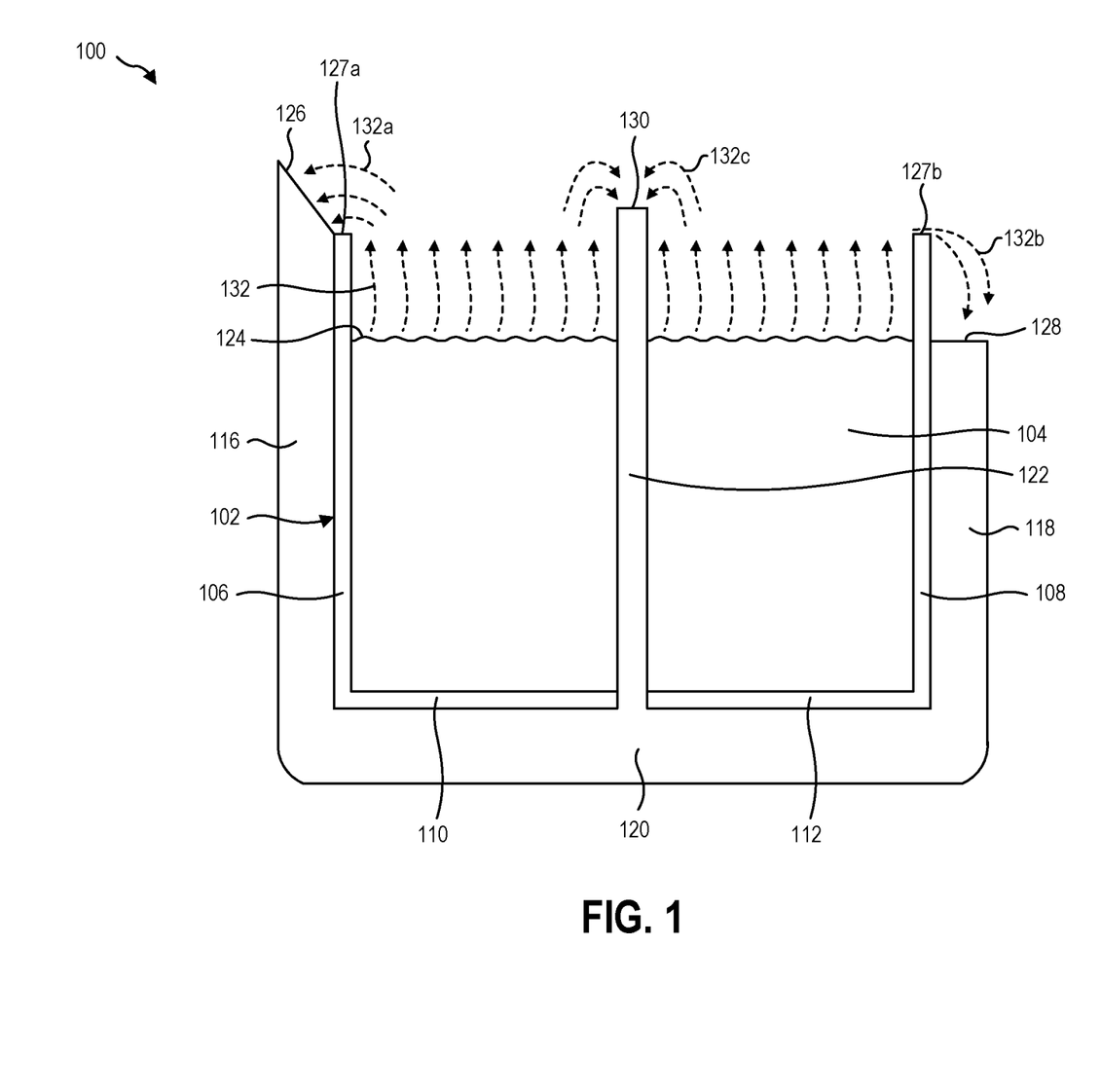
FIG. 1 illustrates an example of a two-phase immersion cooling system that is configured to mitigate vapor loss in accordance with the present disclosure, the cooling system including a plurality of supplemental condensers and a plurality of vapor collection points.

FIG. 1 illustrates aspects of a two-phase immersion cooling system 100 that is configured to mitigate vapor loss in accordance with the present disclosure. The cooling system 100 includes an immersion tank 102 that is configured to retain dielectric working fluid 104. The immersion tank 102 is also configured to hold a plurality of computing devices (not shown) such that the computing devices are submerged in the working fluid 104. Certain parts of the immersion tank 102 are visible in FIG. 1. In particular, FIG. 1 shows a first side wall 106 of the immersion tank 102, a second side wall 108 of the immersion tank 102, a first bottom wall portion 110 of the immersion tank 102, and a second bottom wall portion 112 of the immersion tank 102.

The working fluid 104 has a relatively low boiling point. When the computing devices that are submerged in the working fluid 104 are powered on, they generate heat. This causes a portion of the working fluid 104 to boil off into a gas, thereby producing vaporized working fluid 132. The immersion tank 102 includes a door (not shown) that can be closed in order to prevent vaporized working fluid 132 from escaping out of the immersion tank 102. From time to time, however, the door may be opened in order to gain access to the computing devices within the immersion tank 102. FIG. 1 illustrates the cooling system 100 at a point in time when the door has been opened.

The cooling system 100 shown in FIG. 1 may include a condenser that is in fluid communication with an interior portion of the immersion tank when the immersion tank is sealed, although this is not visible in FIG. 1. In addition, the cooling system 100 also includes several additional condensers that are not included in known two-phase immersion cooling systems and that facilitate the condensation of vaporized working fluid 132 when the immersion tank 102 is open. As indicated above, such condensers may be referred to herein as supplemental condensers. In the depicted embodiment, the supplemental condensers include a first supplemental condenser 116, a second supplemental condenser 118, and a third supplemental condenser 120. The supplemental condensers 116, 118, 120 are not in fluid communication with the interior portion of the immersion tank 102 when the immersion tank 102 is sealed. However, the supplemental condensers 116, 118, 120 are able to capture vaporized working fluid 132 when the immersion tank 102 is opened.

The first supplemental condenser 116 and the second supplemental condenser 118 are positioned against a side portion of the immersion tank 102. In particular, the first supplemental condenser 116 abuts the first side wall 106 of the immersion tank 102, and the second supplemental condenser 118 abuts the second side wall portion 108 of the immersion tank 102. The third supplemental condenser 120 is positioned underneath the immersion tank 102. In particular, the third supplemental condenser 120 abuts the first bottom wall portion 110 of the immersion tank 102 and the second bottom wall portion 112 of the immersion tank 102.

The temperature of the supplemental condensers 116, 118, 120 is kept at or below the condensation point of the working fluid 104, at least while the immersion tank 102 is open. In some embodiments, this is accomplished by pumping cool fluid through the supplemental condensers 116, 118, 120.

Each of the supplemental condensers 116, 118, 120 is in fluid communication with a vapor collection point that is positioned at or near the upper edge of the immersion tank. The cooling system 100 includes different types of vapor collection points. For example, the cooling system 100 includes a rollover vapor collection point 128 that is in fluid communication with the second supplemental condenser 118. The rollover vapor collection point 128 is positioned below an upper edge 127b of the immersion tank 102. In other words, the upper edge 127b of the immersion tank 102 is above the liquid level (the level of the working fluid 104 in the immersion tank 102), and it is also above the rollover vapor collection point 128. As indicated above, vaporized working fluid 132 is typically heavier than air and will generally roll over the upper edge 127b of the immersion tank 102 if allowed to do so. Therefore, the rollover vapor collection point 128 allows the vaporized working fluid 132b that rolls over the upper edge 127b of the immersion tank 102 to be collected. The outer wall of the immersion tank 102 can act as a barrier to help guide the vaporized working fluid 132b into the immersion tank 102. Positioning the upper edge 127b of the immersion tank 102 above the rollover vapor collection point 128 can help to ensure that most of the vaporized working fluid 132b is collected in the rollover vapor collection point 128 instead of falling onto the floor.

The cooling system 100 also includes an above-edge vapor collection point 126 that is positioned above an upper edge 127a of the immersion tank 102. The above-edge vapor collection point 126 is in fluid communication with the first supplemental condenser 116.

In the embodiment shown in FIG. 1, the above-edge vapor collection point 126 includes an angled edge. However, the scope of the present disclosure is not limited in this regard. In an alternative embodiment, an above-edge vapor collection point may include a straight edge.

The cooling system 100 also includes an interior vapor collection point 130 that is positioned within an interior portion of the immersion tank 102. In the depicted embodiment, the interior vapor collection point 130 is positioned in a central portion of the immersion tank 102. In other words, the interior vapor collection point 130 is positioned substantially in the middle of the immersion tank 102. The interior vapor collection point 130 includes a tube 122 that is in fluid communication with the third supplemental condenser 120. The interior vapor collection point 130 allows vaporized working fluid 132 that is at or near the middle of the immersion tank 102 to be collected when the door to the immersion tank 102 is opened. In addition, the interior vapor collection point 130 may reduce the air currents that are produced when the door to the immersion tank 102 is opened. The interior vapor collection point 130 may be positioned above the upper surface 124 of the working fluid 104 but below the top level of the vaporized working fluid 132.

The vapor collection points 126, 128, 130 can be thought of as a plurality of drains that are strategically placed around the immersion tank 102 for the purpose of recapturing vaporized working fluid 132. The vapor collection points 126, 128, 130 are positioned so that in the presence of strong air currents (which may arise when the door to the immersion tank 102 is opened) that try to push the vaporized working fluid 132 out of the immersion tank 102, the vaporized working fluid 132 can be recaptured at the vapor collection points 126, 128, 130 instead of escaping out of the immersion tank 102. FIG. 1 shows a portion 132*a* of the vaporized working fluid 132 entering the first supplemental condenser 116 at the above-edge vapor collection point 126, another portion 132*b* of the vaporized working fluid 132 entering the second supplemental condenser 118 at the rollover edge vapor collection point 128, and another portion 132*c* of the vaporized working fluid 132 entering the third supplemental condenser 120 at the interior vapor collection point 130.

Figure 1A:
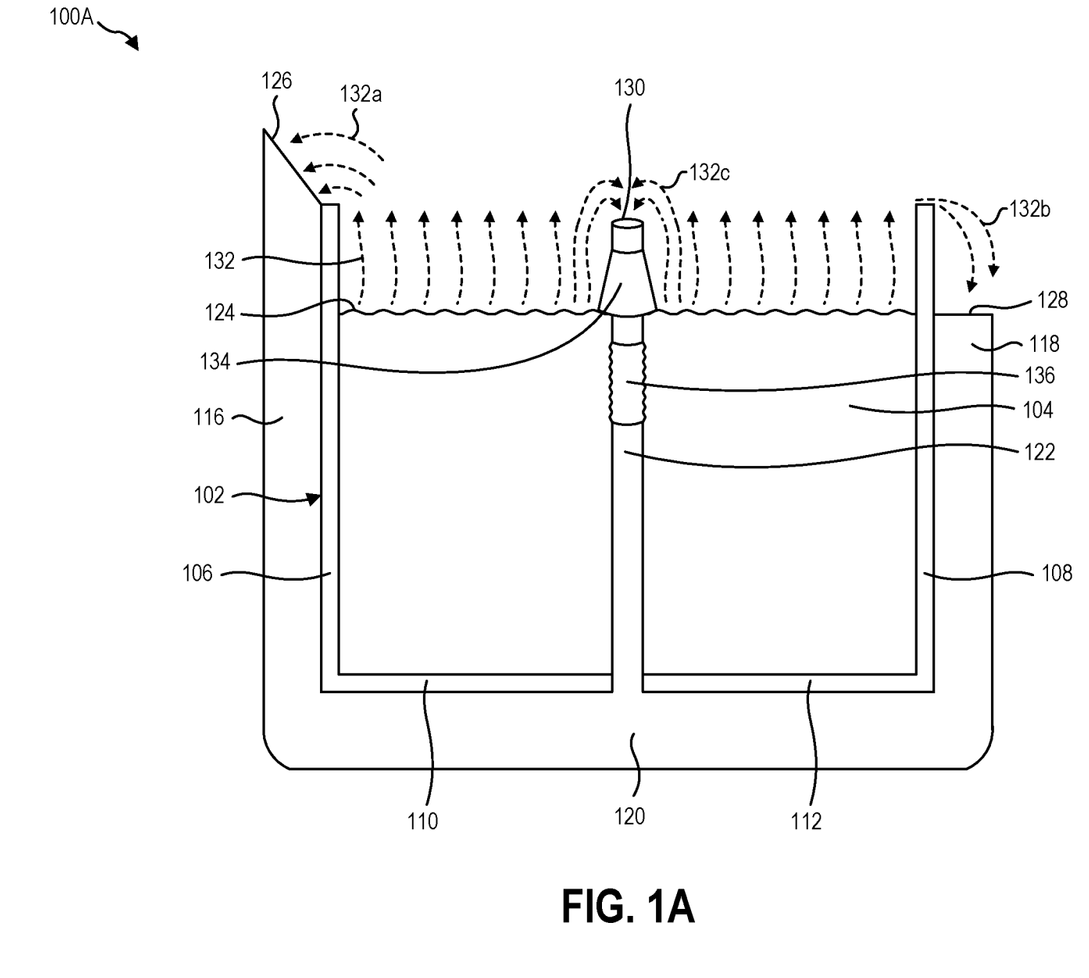
FIG. 1A illustrates another example of a two-phase immersion cooling system that is configured to mitigate vapor loss in accordance with the present disclosure, the cooling system including a mechanism for ensuring that the interior vapor collection point stays above the upper surface of the working fluid.

FIG. 1A illustrates another example of a two-phase immersion cooling system 100A that is configured to mitigate vapor loss in accordance with the present disclosure. The cooling system 100A shown in FIG. 1A is similar to the cooling system 100 shown in FIG. 1, except that it additionally includes a floating member 134 that is affixed to the tube 122. In addition, the tube 122 also includes a flexible section 136 that is located beneath the point where the floating member 134 is affixed to the tube 122. The floating member 134 and the flexible section 136 make it more likely that the interior vapor collection point 130 stays above the upper surface 124 of the working fluid 104.

The floating member 134 may be made of any material that can float on the working fluid 104. In other words, the floating member 134 is able to remain suspended on the upper surface 124 of the working fluid 104 without sinking. A wide variety of materials can be used to form the floating member 134. In some implementations, the working fluid 104 may be relatively dense, and materials or structures that may not float on liquids such as water may nevertheless float on the working fluid.

The amount of working fluid 104 in the immersion tank 102 may vary, depending on various factors such as the amount of heat that is being produced by the computing devices in the immersion tank 102 and the amount of evaporation that has occurred. If the tube 122 does not include the flexible section 136 (as in the cooling system 100 shown in FIG. 1), then the interior vapor collection point 130 would typically remain at a fixed position. As the amount of working fluid 104 in the immersion tank 102 increases and the position of the upper surface 124 of the working fluid 104 rises, it is possible that the amount of working fluid 104 in the immersion tank 102 could increase to a point where the upper surface 124 of the working fluid 104 is above the interior vapor collection point 130. This would, of course, defeat the purpose of the interior vapor collection point 130 because the interior vapor collection point 130 would no longer be able to capture vaporized working fluid 132. However, including the flexible section 136 in the tube 122 makes it possible for the position of the interior vapor collection point 130 to change. In other words, the length of the tube 122 can increase or decrease. Moreover, affixing the floating member 134 to the tube 122 ensures that the interior vapor collection point 130 remains above the upper surface 124 of the working fluid 104.

In some embodiments, the inlet to the tube 122 (i.e., the interior vapor collection point 130) can be kept a defined, measured distance above the upper surface 124 of the working fluid 104. That distance can correspond to the desired height of the vaporized working fluid 132. In other words, the inlet to the tube 122 can be set to the desired vapor level height.

Figure 2:
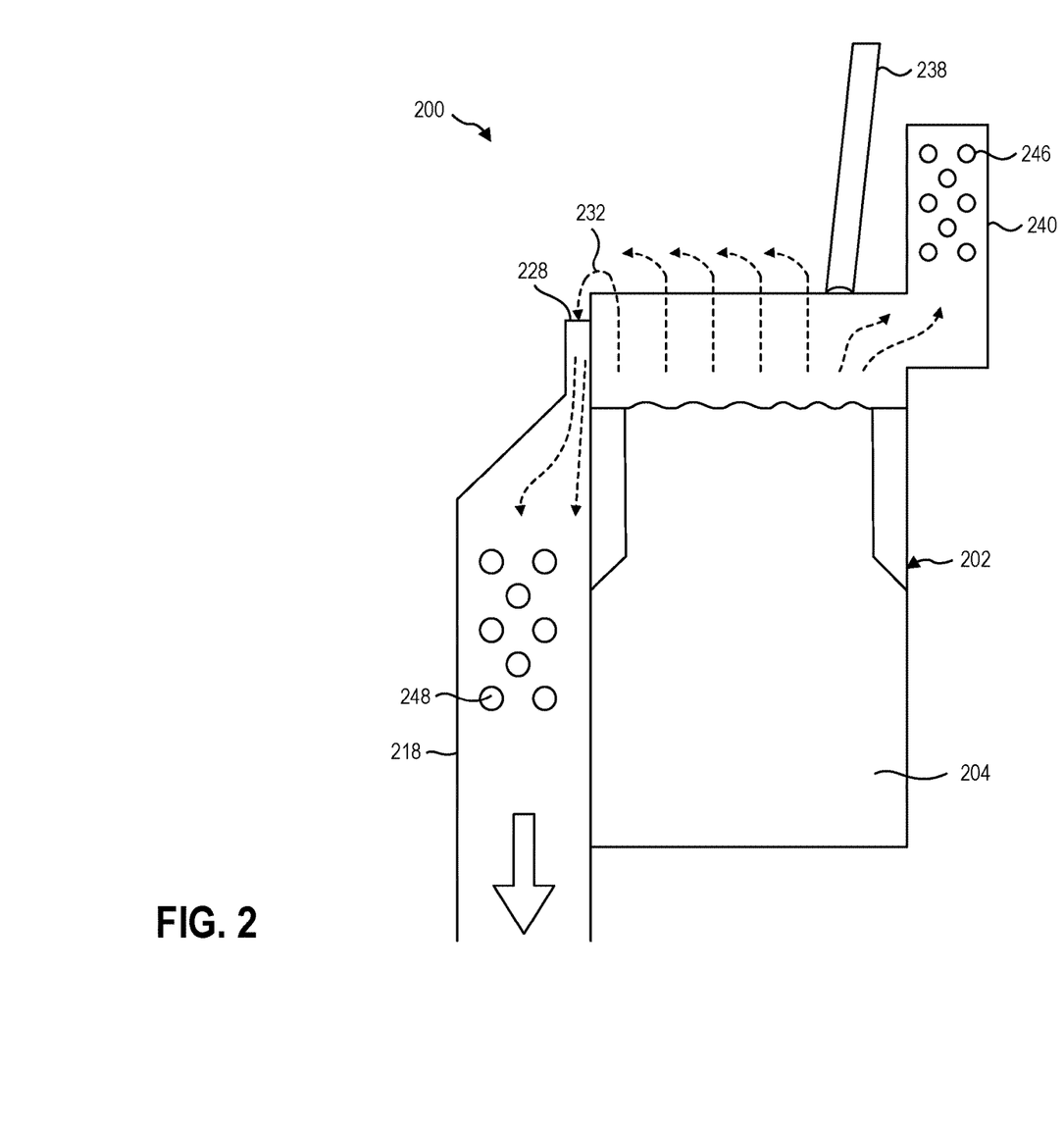
FIG. 2 illustrates another example of a two-phase immersion cooling system that is configured to mitigate vapor loss in accordance with the present disclosure, the cooling system including a rollover vapor collection point that is in fluid communication with a supplemental condenser.

FIG. 2 illustrates another example of a two-phase immersion cooling system 200 that is configured to mitigate vapor loss in accordance with the present disclosure. The cooling system 200 includes a condenser 240 that is in fluid communication with an interior portion of the immersion tank 202 when the immersion tank 202 is sealed. In addition, the cooling system 200 also includes a supplemental condenser 218 that facilitates the condensation of vaporized working fluid 232 when the immersion tank 202 is open.

When the door 238 is closed, the vaporized working fluid 232 enters the condenser 240. The temperature of the condenser 240 is kept cooler than the condensation point of the working fluid 204. Therefore, as the vaporized working fluid 232 enters the condenser 240, the vaporized working fluid 232 condenses back into a liquid. The circles shown in the internal condenser 240 represent condensed working fluid 246.

When the door 238 is open, the vaporized working fluid 232 can escape out of the immersion tank 202. The supplemental condenser 218 is able to capture at least some of the vaporized working fluid 232 that would otherwise be lost.

The supplemental condenser 218 is positioned on the side of the immersion tank 202. The cooling system 200 includes a rollover vapor collection point 228 that is in fluid communication with the supplemental condenser 218. The rollover vapor collection point 228 is positioned below the upper edge of the immersion tank 202. The rollover vapor collection point 228 allows the vaporized working fluid 232 that rolls over the upper edge of the immersion tank 202 to be collected.

When the vaporized working fluid 232 enters the supplemental condenser 218, the vaporized working fluid 232 condenses back into the liquid form of the working fluid 204. The circles shown in the supplemental condenser 218 represent condensed working fluid 248.

Figure 3A:
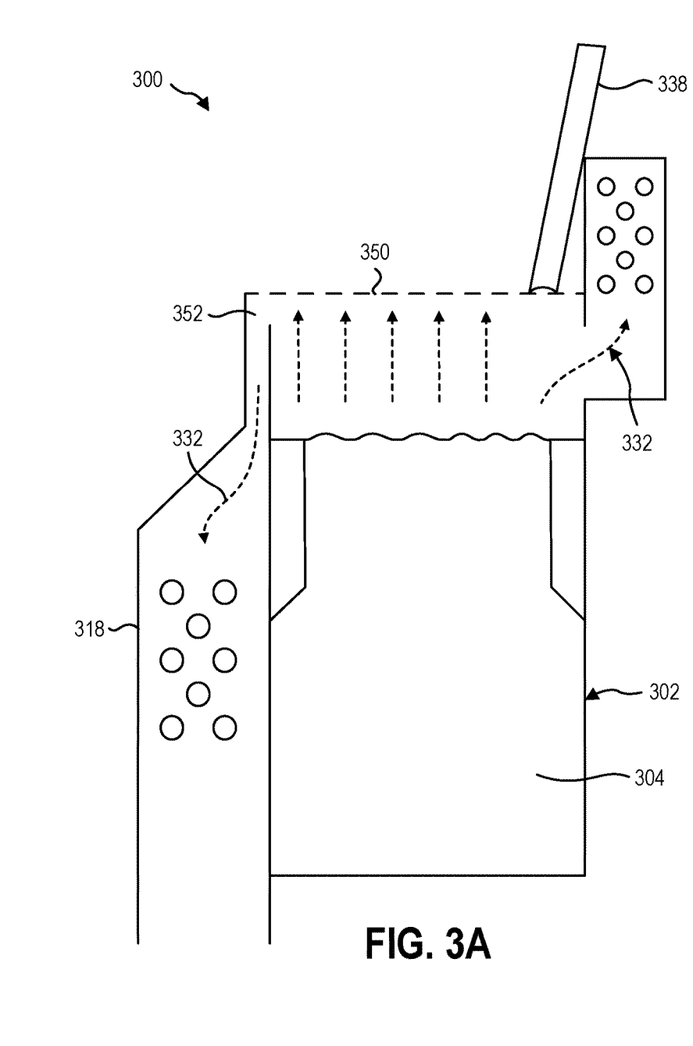
FIGS. 3A and 3B illustrate an example of a two-phase immersion cooling system in which a plurality of vapor collection apertures are positioned around the peripheral region of the immersion tank.
Figure 3B:
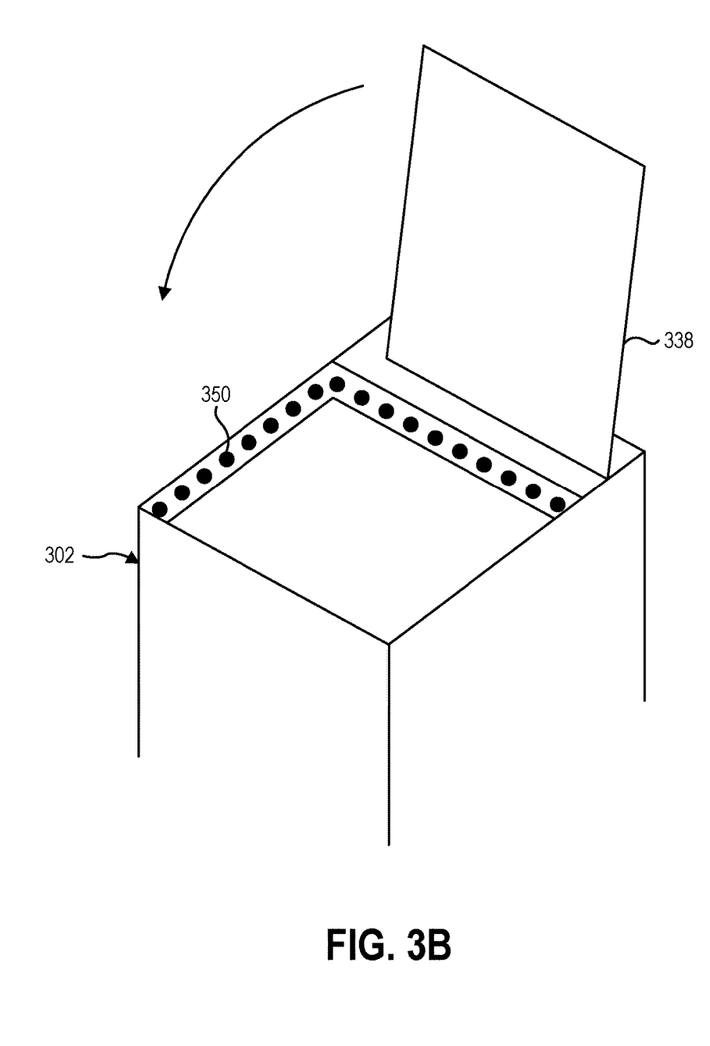

FIGS. 3A and 3B illustrate an example of a two-phase immersion cooling system 300 in which a plurality of vapor collection apertures 350 are positioned around the peripheral region of the immersion tank 302. The vapor collection apertures 350 are shown most clearly in FIG. 3B, although they are also visible in FIG. 3A.

The vapor collection apertures 350 are in fluid communication with a supplemental condenser 318. If air currents cause vaporized working fluid 332 to be pushed toward the peripheral region of the immersion tank 302, at least some of the vaporized working fluid 332 should sink downward (assuming that the vaporized working fluid 332 is heavier than air) and enter the supplemental condenser 318 through the vapor collection apertures 350.

In some embodiments, a two-phase immersion cooling system in accordance with the present disclosure may include a mechanism for increasing the amount of condensation that occurs when the immersion tank is open. As indicated above, cool liquid may be pumped through the condenser(s) in order to keep the condenser(s) at a desired temperature. In some embodiments, the cooling system may include control circuitry that is configured to cause the speed of one or more condenser pumps to be increased in response to a signal indicating that the immersion tank is going to be opened. This has the effect of maximizing the flow of cool liquid through the condensers (and thereby maximizing the amount of condensation that occurs) when the immersion tank is open.

In addition, a two-phase immersion cooling system in accordance with the present disclosure may be configured to facilitate additional capture of vaporized working fluid by creating suction pressure at the vapor collection points around an immersion tank when the immersion tank is opened. The suction pressure may be created through the use of one or more fluid displacement devices that are positioned so as to create a vacuum within the supplemental condensers. This vacuum creates suction pressure at the vapor collection points, which draws more vaporized working fluid into the vapor collection points.

In other words, one or more fluid displacement devices may be used to create negative pressure at the vapor collection points. The fluid displacement devices may be placed at one or more collection points, at one or more vapor/air return points, at one or more duct exits, and/or anywhere in between. The discharge side of a particular fluid displacement device should point away from the collection point for which it is creating negative pressure. Some examples of fluid displacement devices that could be used include pressurization fans and pumps, such as Roots-type pumps, Lysholm (screw-type) pumps, turbines, piston pumps, or the like.

The suction pressure may be created in response to a signal indicating that the immersion tank is going to be opened. For example, a two-phase immersion cooling system in accordance with the present disclosure may include control circuitry that is configured to cause the speed of the fluid displacement device(s) to be increased in response to a signal indicating that the immersion tank is going to be opened.

The mechanisms for increasing the amount of condensation that occurs when a particular immersion tank is open and also for creating suction pressure at vapor collection points around the immersion tank may be independent of the immersion tank itself. In other words, the same mechanisms for increasing condensation and for creating suction pressure can be used in connection with more than one type of immersion tank. For example, the mechanisms for increasing condensation and for creating suction pressure as disclosed herein may be used in connection with both individual, all-in-one immersion tank designs as well as building-level integrated immersion tank designs. The mechanisms for increasing condensation and for creating suction pressure as disclosed herein may also be used in connection with immersion tanks that use different pressure equalization methods.

Figure 4:
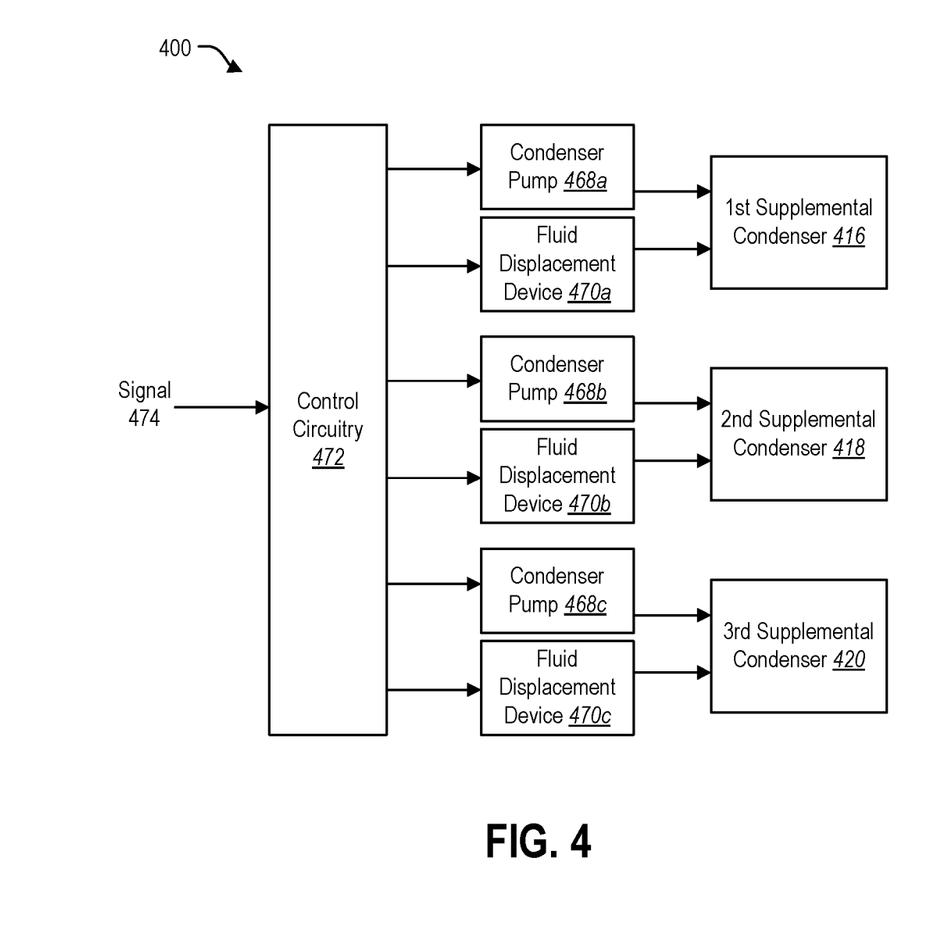
FIG. 4 illustrates an example of a two-phase immersion cooling system that is configured to create suction pressure at the vapor collection points around an immersion tank when the immersion tank is opened.

FIG. 4 illustrates an example of a two-phase immersion cooling system 400 that is configured to create suction pressure at the vapor collection points around an immersion tank when the immersion tank is opened. The cooling system 400 is also configured to increase the amount of condensation that occurs when the immersion tank is open. Although the immersion tank in the cooling system 400 is not shown in FIG. 4, the immersion tank may be similar to any of the immersion tanks 102, 202, 302 that have been described previously.

The cooling system 400 includes a plurality of supplemental condensers, including a first supplemental condenser 416, a second supplemental condenser 418, and a third supplemental condenser 420. The supplemental condensers 416, 418, 420 may be similar to the supplemental condensers 116, 118, 120 that were discussed above in connection with the cooling system 100 shown in FIG. 1.

To maintain the supplemental condensers 416, 418, 420 at a suitable temperature (e.g., below the condensation point of the working fluid), cool liquid may be pumped through the supplemental condensers 416, 418, 420. Thus, the cooling system 400 includes a plurality of condenser pumps 468a-c that are configured to pump cool liquid through the supplemental condensers 416, 418, 420 in the system 400.

The cooling system 400 also includes control circuitry 472. The control circuitry 472 is configured to cause the speed of the condenser pumps 468a-c to be increased in response to a signal 474 indicating that the immersion tank is going to be opened. This has the effect of maximizing the flow of cool liquid through the supplemental condensers 416, 418, 420 when the immersion tank is open, thereby maximizing the amount of condensation of vaporized working fluid that occurs.

The cooling system 400 may include one or more vapor collection points that are in fluid communication with the plurality of supplemental condensers 416, 418, 420. Although the vapor collection points are not shown in FIG. 4, they may be similar to the vapor collection points 126, 128, 130 that were discussed above in connection with the cooling system 100 shown in FIG. 1. To enable suction pressure to be created at the vapor collection points, the cooling system 400 includes a plurality of fluid displacement devices 470a-c that are positioned so as to create a vacuum (or, in other words, negative pressure) within the supplemental condensers 416, 418, 420.

In addition to causing the speed of the condenser pumps 468a-c to be increased, the control circuitry 472 may also be configured to cause the speed of the fluid displacement devices 470a-c to be increased in response to a signal 474 indicating that the immersion tank is going to be opened. In some embodiments, the fluid displacement devices 470a-c may be kept off when the immersion tank is closed, and then the control circuitry 472 may activate the fluid displacement devices 470a-c in response to the signal 474 indicating that the immersion tank is going to be opened.

For example, the door to the immersion tank may include a handle that is equipped with a touch sensor. The touch sensor may be in electronic communication with the control circuitry 472. When the touch sensor detects that a person's hand is in contact with the handle (which suggests that the door is likely to be opened), the touch sensor may provide a signal 474 to the control circuitry 472.

As another example, the signal 474 may be generated in response to user input provided by an operator of the cooling system 400. For instance, when an operator of the cooling system 400 is about to open the door to the immersion tank, the operator may provide some type of user input (e.g., by pressing a button on the immersion tank) indicating that the door is about to be opened. In response to this user input, the signal 474 may be generated and provided to the control circuitry 472.

As another example, the immersion tank may be opened on a scheduled basis. In such embodiments, the signal 474 may be generated and provided to the control circuitry 472 whenever the immersion tank is scheduled to be opened.

Another aspect of the present disclosure is related to immersion tanks that include "swing-up" doors, i.e., doors that are pulled upward when they are opened. In particular, another aspect of the present disclosure is related to preventing vaporized working fluid from being pulled out of the immersion tank when a swing-up door on the immersion tank is opened.

An immersion tank typically includes a basin that is configured to retain dielectric working fluid. The basin is also configured to retain a plurality of computing devices that are submerged in the dielectric working fluid. A door may be connected to the basin such that closing the door seals the immersion tank and prevents vaporized working fluid from escaping out of the immersion tank.

When an immersion tank includes a door that swings, the air in the path of the door swing is compressed and pushed out of the way. As the door swings open, the volume behind the door will increase, thereby creating negative pressure. The area where the negative pressure is created is the area immediately above the working fluid. As a result of this negative pressure, air from the room will attempt to fill the space. If the door is opened quickly, the air movement can cause a significant amount of turbulence, thereby disturbing the vaporized working fluid.

To address this problem, a door to an immersion tank may be equipped with one or more vents. The door vent(s) may be configured to permit some of the colder air outside of the immersion tank to pass through the door vent(s) into the interior portion of the immersion tank when the door is opening or about to be opened. Allowing room air to pass through the door in this way should reduce the air displacement of a swing-up door, lessening the negative pressure above the vaporized working fluid and reducing the amount of vaporized working fluid that is disturbed by the action. In other words, the door vent(s) should reduce the amount of "turbulence" that occurs during the opening of swing-up doors, thereby increasing the efficiency of any vapor collection methods that are utilized.

In some implementations, the door vent(s) may be one-way vents that only permit movement of air (or other gaseous substances) in a single direction. The door vent(s) may be configured so that, when the door to the immersion tank is being opened (or is about to be opened), outside air is permitted to pass through the door vent(s) into the immersion tank, but nothing (including vaporized working fluid) is permitted to pass from inside the immersion tank to the outside. In other words, the door vent(s) may be configured to permit movement of air from outside the immersion tank into an interior portion of the immersion tank without permitting the vaporized working fluid to escape out of the immersion tank.

In some implementations, the door vent(s) may be actuated vents that are opened and closed by an actuator. The actuator may be configured to open the door vent(s) in response to a signal indicating that the door to the immersion tank is being opened (or is about to be opened). For example, the door to the immersion tank may include a handle that is equipped with a touch sensor. The touch sensor may be in electronic communication with the actuator. When the touch sensor detects that a person's hand is in contact with the handle (which suggests that the door is likely to be opened), the touch sensor may cause the actuator to open the door vent(s).

As another example, the actuator may be configured to open the door vent(s) in response to user input provided by an operator of the cooling system. For example, when an operator of the cooling system is about to open the door to the immersion tank, the operator may provide some type of user input (e.g., by pressing a button on the immersion tank) indicating that the door is about to be opened. In response to this user input, the actuator may open the door vent(s).

As another example, the immersion tank may be opened on a scheduled basis. In such embodiments, the actuator may open the door vent(s) whenever the immersion tank is scheduled to be opened.

One or more door vents may be utilized in combination with any of the other techniques for mitigating the loss of vaporized working fluid that are disclosed herein.

Figure 5:
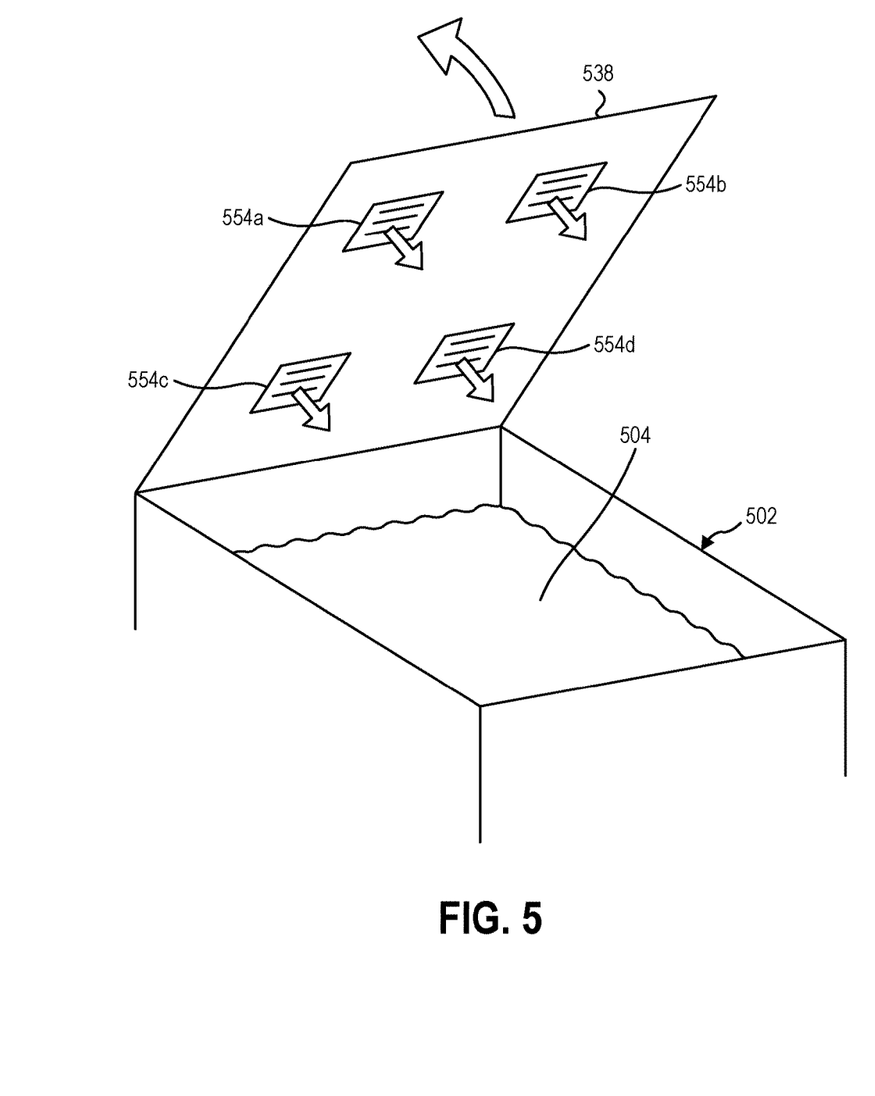
FIG. 5 illustrates an example of an immersion tank that includes a swing-up door with a plurality of vents.

FIG. 5 illustrates an example of an immersion tank 502 that includes a swing-up door 538 with a plurality of vents 554*a-d*. As discussed above, when the door 538 swings open, negative pressure is created in the area immediately above the working fluid 504. As a result of this negative pressure, air from the room will attempt to fill the space. If the door 538 is opened quickly, the air movement can cause a significant amount of turbulence, thereby disturbing the vaporized working fluid.

The vents 554*a-d* are designed to permit some of the colder air outside of the immersion tank 502 to pass through the vents 554*a-d* into the interior portion of the immersion tank 502 when the door 538 is being opened (or is about to be opened). This reduces the air displacement of the door 538, lessening the negative pressure above the vaporized working fluid and reducing the amount of vaporized working fluid that is disturbed by the action of opening the door 538. This should reduce the amount of vaporized working fluid that is pushed out of the immersion tank 502 when the door 538 is opened.

Another aspect of the present disclosure is related to actively removing excess working fluid from a computing device as the computing device is being removed from the immersion tank. To accomplish this, a device that is configured to blow a gaseous substance (e.g., air) in a particular direction could be used. Such a device may be referred to herein as a directional blowing device.

In some embodiments, the directional blowing device may be a handheld, wand-type device. Alternatively, the directional blowing device may be mounted or otherwise attached to some type of machinery that is lifting computing device(s) out of the immersion tank.

As a computing device is being pulled upward out of the immersion tank, the directional blowing device could be used to blow a gaseous substance against the computing device in a downward direction, so that any excess working fluid on the computing device is blown back into the pool of working fluid in the immersion tank. Alternatively, instead of blowing the excess working fluid back into the immersion tank, the directional blowing device could instead be used to blow excess working fluid toward a condenser.

In some embodiments, the gaseous substance that is blown by the directional blowing device could be heated in order to cause the working fluid to evaporate. This could potentially expedite the removal of working fluid from the computing device.

In some embodiments, a scooping device may be placed just underneath the directional blowing device. The scooping device may include a vacuum that can apply a suction force to capture the working fluid in either liquid or vaporous form that has been blown off of a computing device. The vacuum could return the working fluid to a condenser or directly into the immersion tank, or it could carry the working fluid to another location where it can be pumped back into the immersion tank (or a different immersion tank).

Figure 6:
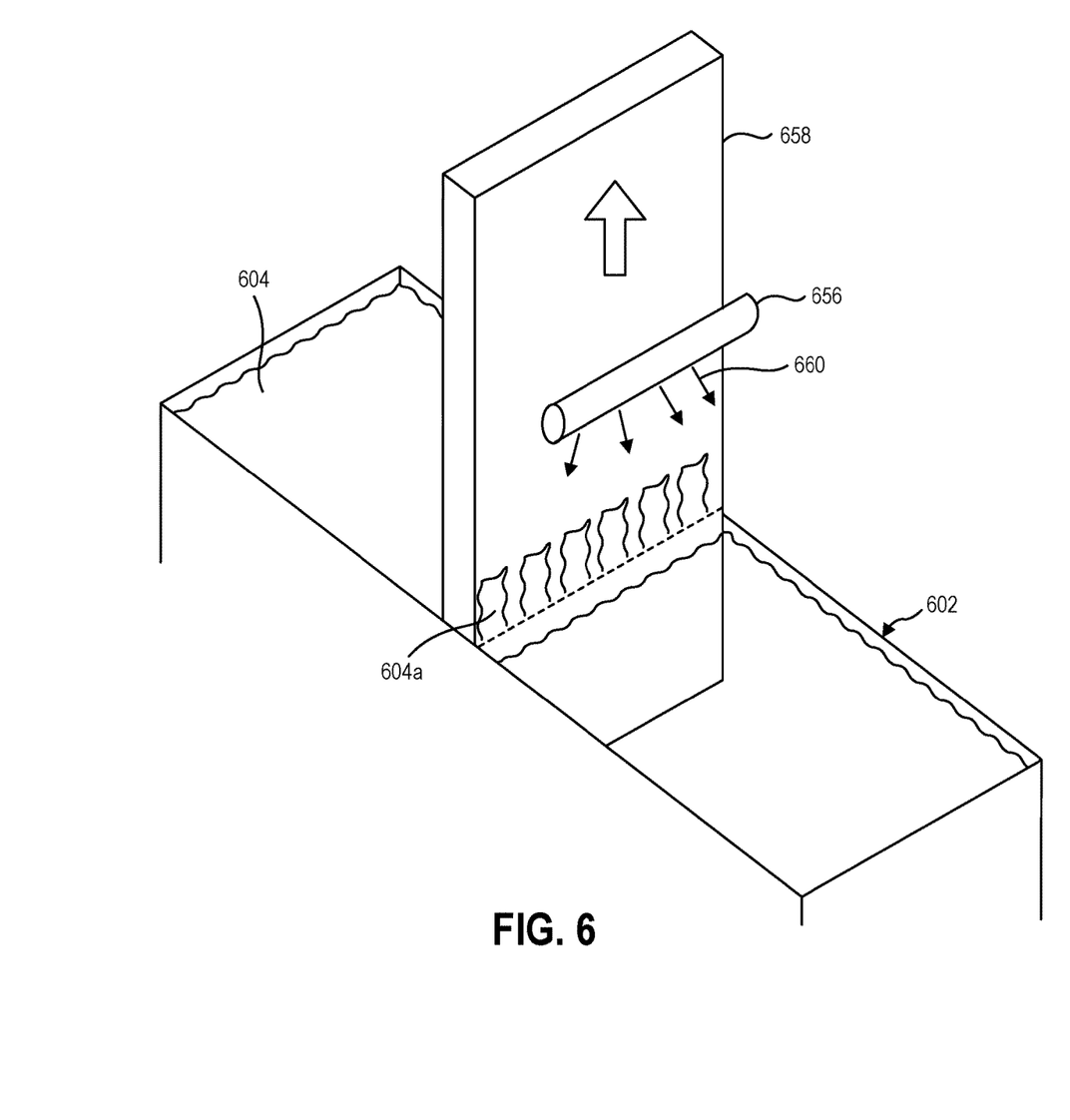
FIG. 6 illustrates an example of a directional blowing device that may be used to actively remove excess working fluid from a computing device as the computing device is being removed from the immersion tank.

FIG. 6 illustrates an example of a directional blowing device 656 that may be used to actively remove excess working fluid 604a from a computing device 658 as the computing device 658 is being removed from the immersion tank 602. FIG. 6 shows the directional blowing device 656 blowing a gaseous substance 660 (e.g., air) against the computing device 658 at high pressure in a downward direction as the computing device 658 is being moved in the upward direction out of the immersion tank 602. This causes the excess working fluid 604a on the computing device 658 to be blown back into the pool of working fluid 604 in the immersion tank 602.

Another aspect of the present disclosure is related to a two-phase immersion cooling system that includes a global fluid reservoir. The global fluid reservoir can be used to replenish working fluid in a plurality of different immersion tanks.

A mixture of air and vaporized working fluid from a plurality of different immersion tanks can be carried, via an air handling system, to a high-pressure chamber. A fluid displacement device may be located adjacent to the high-pressure chamber. The fluid displacement device may be responsible for creating the high pressure inside the high-pressure chamber.

In the high-pressure chamber, the mixture can be drawn through one or more traps. In this context, the term "trap" may refer to a device that captures vaporized working fluid. Chemicals (e.g., a mix of halogen compounds and carbon filtration) may be used to pressurize the mixture, causing the working fluid to become more concentrated. The pressurization can increase the part per million count of the vaporized working fluid in order to enable better extraction from air.

The high-pressure chamber includes a condenser, and the concentrated mixture can be forced through the condenser. The temperature of the condenser can be maintained so that it is both (i) cold enough to cause the working fluid to condense, and also (ii) above the dew point of the environment surrounding the condenser. Thus, the condenser produces condensed working fluid but does not cause the water vapor in the air to condense.

The global fluid reservoir is in fluid communication with the condenser. Thus, the condensed working fluid can be collected and returned to the global fluid reservoir. The global fluid reservoir is also in fluid communication with the plurality of immersion tanks. Control circuitry may be provided that causes the working fluid in the plurality of immersion tanks to be replenished from the global fluid reservoir. In other words, when a particular immersion tank needs additional working fluid, that additional working fluid may be supplied by the global fluid reservoir. Air that has been processed can be sent through a filtering medium (e.g., a carbon filter) before being returned to circulation and/or vented.

In some embodiments, an air handling system that carries the mixture of air and vaporized working fluid to the high-pressure chamber may utilize direct suction at the point of evaporation and/or near the opening of the immersion tank. For example, an air handling system may include one or more vapor collection points (e.g., the vapor collection points 126, 128, 130 described above in connection with the cooling system 100 shown in FIG. 1) and one or more fluid displacement devices that are positioned to create suction pressure at the vapor collection point(s) to capture vaporized working fluid, as described above. An air handling system may also include some type of mechanism (e.g., one or more tubes, ducts, and/or pipes) that carry the vaporized working fluid to the high-pressure chamber. In some embodiments, an air handling system may utilize a drop ceiling and/or a fume hood-style aperture to carry the vaporized working fluid from the vapor collection points to the high-pressure chamber.

Figure 7:
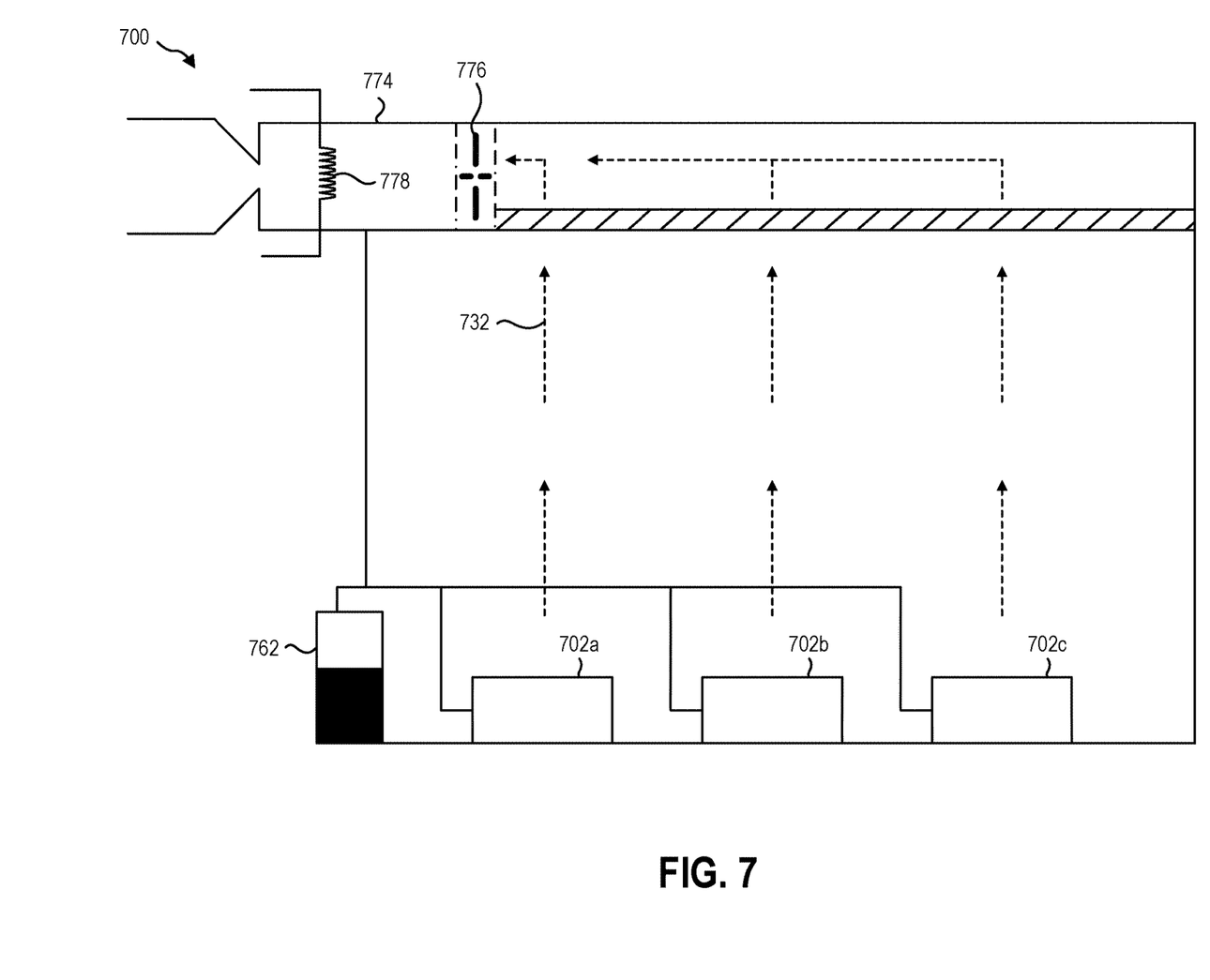
FIG. 7 illustrates an example of a two-phase immersion cooling system including a global fluid reservoir that can be used to replenish working fluid in a plurality of different immersion tanks.

FIG. 7 illustrates an example of a two-phase immersion cooling system 700 including a global fluid reservoir 762 that can be used to replenish working fluid in a plurality of different immersion tanks 702a-c.

FIG. 7 shows a mixture of air and vaporized working fluid 732 from a plurality of different immersion tanks 702a-c being carried to a high-pressure chamber 774. A pressurization fan 776 is located adjacent to the high-pressure chamber 774. The pressurization fan 776 creates the high pressure inside the high-pressure chamber 774.

The high-pressure chamber 774 includes a condenser 778, and the mixture of air and vaporized working fluid 732 from the plurality of different immersion tanks 702a-c can be forced through the condenser 778. The temperature of the condenser 778 is kept below the condensation point of the vaporized working fluid 732, so that the condenser 778 is cold enough to cause the vaporized working fluid 732 to condense. At the same time, however, the temperature of the condenser 778 is kept above the dew point of the high-pressure chamber 774. Therefore, the condenser 778 produces condensed working fluid but does not cause the water vapor in the air to condense.

The global fluid reservoir 762 is in fluid communication with the condenser 778. Thus, the condensed working fluid can be collected and returned to the global fluid reservoir 762. The global fluid reservoir 762 is also in fluid communication with the plurality of immersion tanks 702a-c. The cooling system 700 may include control circuitry that causes the working fluid in the plurality of immersion tanks 702a-c to be replenished from the global fluid reservoir 762. In other words, when one of the plurality of immersion tanks 702a-c needs additional working fluid, that additional working fluid may be supplied from the global fluid reservoir 762.

Some examples of various terms and phrases that have been used in the above discussion will now be provided.

The term "immersion tank" may refer to any container that is sufficiently large and sturdy to retain a plurality of computing devices that are submerged in dielectric working fluid. An immersion tank that is used in a two-phase immersion cooling system may be capable of being sealed so that vaporized working fluid does not escape from the immersion tank.

The term "dielectric working fluid" (or simply "working fluid") may refer to any nonconductive fluid in which computing devices can be submerged for the purpose of cooling the computing devices. Some examples of dielectric working fluids that can be used include synthetic fluids, fluorocarbon-based fluids, mineral oil, and deionized water. A dielectric working fluid may have a relatively low boiling point (e.g., 40-50° C.), such that heat generated by computing devices causes the dielectric working fluid to boil.

The term "condenser" may refer to any apparatus that may be used to condense vaporized working fluid. In some embodiments, a condenser may include one or more tubes, which may be shaped in the form of one or more coils. Cool liquid may be pumped through the tubes to facilitate condensation of vaporized working fluid. The term "condenser pump" may refer to any machine or device for causing cool liquid to flow through one or more condensers.

In some embodiments, two structures are in "fluid communication" with one another if there is a path for a fluid to flow between the two structures. In this context, the term "fluid" may refer generally to any substance that has the tendency to assume the shape of its container, and may include a liquid or a gas.

The term "vapor collection point" may refer to any location at or near an immersion tank where vaporized working fluid can be collected. A vapor collection point may be in fluid communication with a condenser. In some embodiments, a vapor collection point may be integral with a condenser. For instance, a vapor collection point may be a part of a condenser where vaporized working fluid enters the condenser. Alternatively, a vapor collection point may be distinct from a condenser, and one or more other structures (e.g., tubes, ducts, pipes) may facilitate fluid communication between the vapor collection point and the condenser.

The term "fluid displacement device" may refer to any device that is capable of creating suction pressure (or, in other words, negative pressure) at one or more vapor collection points. A fluid displacement device may alternatively be referred to as a vapor/air moving device. In some embodiments, a fluid displacement device may create suction pressure by creating a current of air in a direction opposite the vapor collection point(s). In some embodiments, a fluid displacement device may be embodied as a pressurization fan, which may include a machine that uses an electric motor to rotate thin, rigid blades in order to move air. In some embodiments, a fluid displacement device may be embodied as an air pump or an air compressor.

The term "suction pressure" may refer to a force that causes a fluid (e.g., vaporized working fluid) to be drawn into a particular space (e.g., a vapor collection point) because of a difference in pressure between the space and the area outside of the space.

The term "vapor collection aperture" may refer to any opening (e.g., a hole, gap, slit) through which vaporized working fluid may pass en route to a condenser.

The "peripheral region" of an object (e.g., an immersion tank) refers to the outside part of an object. For instance, the vapor collection apertures 350 in the immersion tank 302 shown in FIG. 3B are located in the peripheral region of the immersion tank 302.

The term "fluid reservoir" may refer to any receptacle or chamber for storing a fluid.

The term "control circuitry" may refer to hardware, software, firmware, or any combination thereof, that performs some or all of the steps, operations, actions, or other functionality disclosed herein in connection with the control circuitry. If implemented in software, the techniques may be realized at least in part by a non-transitory computer-readable medium having computer-executable instructions stored thereon that, when executed by at least one processor, implement the disclosed functionality.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The steps, operations, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for two-phase immersion cooling, the method comprising:
   unsealing an immersion tank used in immersion cooling of a computing device, the immersion tank at least partially filled with dielectric working fluid, the computing device submerged in the dielectric working fluid;
   creating a negative pressure at a vapor collection point, wherein the vapor collection point is not in fluid communication with an interior portion of the immersion tank when the immersion tank is sealed; and
   when the immersion tank is unsealed, collecting, at the vapor collection point, working fluid vapor from the dielectric working fluid.

2. The method of claim 1, wherein unsealing the immersion tank includes opening a door covering the interior portion of the immersion tank.

3. The method of claim 1, wherein creating the negative pressure includes creating the negative pressure when the immersion tank is unsealed.

4. The method of claim 1, wherein creating the negative pressure includes increasing the negative pressure when the immersion tank is unsealed.

5. The method of claim 1, wherein collecting, at the vapor collection point, the working fluid vapor includes collecting the working fluid vapor at a plurality of vapor collection apertures positioned around a peripheral region of the immersion tank.

6. The method of claim 1, further comprising pumping the working fluid vapor to a condenser.

7. The method of claim 6, further comprising cooling the condenser when the immersion tank is unsealed.

8. A method for two-phase immersion cooling, the method comprising:
   receiving a signal that an immersion tank used in immersion cooling of a computing device has been unsealed, the immersion tank at least partially filled with dielectric working fluid, the computing device submerged in the dielectric working fluid;
   based on the signal, creating a negative pressure at a vapor collection point to collect working fluid vapor, wherein the vapor collection point is not in fluid communication with an interior portion of the immersion tank when the immersion tank is sealed; and
   condensing the working fluid vapor at a supplemental condensing system.

9. The method of claim 8, wherein condensing the working fluid vapor includes decreasing a temperature of the supplemental condensing system upon receipt of the signal.

10. The method of claim 8, wherein the supplemental condensing system includes a plurality of supplemental condensing systems, and wherein condensing the working fluid vapor includes condensing the working fluid vapor at the plurality of supplemental condensing systems.

11. The method of claim 10, wherein the plurality of supplemental condensing systems are located at different location around the immersion tank.

12. The method of claim 8, wherein the vapor collection point is a rollover collection point positioned below an upper edge of the immersion tank.

13. The method of claim 8, wherein receiving the signal includes receiving the signal in response to a sensor.

14. A two-phase immersion cooling system, comprising:
a plurality of immersion tanks that are configured to retain dielectric working fluid and also configured to retain a plurality of computing devices that are submerged in the dielectric working fluid;
a supplemental condenser that facilitates condensation of vaporized working fluid when the plurality of immersion tanks are open, wherein the supplemental condenser is not in fluid communication with an interior portion of the plurality of immersion tanks when the plurality of immersion tanks are sealed;
a plurality of vapor collection points that are in fluid communication with the supplemental condenser; and
a fluid displacement device that is configured to create suction pressure at the vapor collection point.

15. The two-phase immersion cooling system of claim 14, wherein the plurality of vapor collection points include a floating member connected to a flexible section, the floating member floating in the dielectric working fluid.

16. The two-phase immersion cooling system of claim 15, wherein the flexible section is located below the floating member.

17. The two-phase immersion cooling system of claim 14, further comprising an air handling system configured to collect the vaporized working fluid and direct the vaporized working fluid from the plurality of vapor collection points to the supplemental condenser.

18. The two-phase immersion cooling system of claim 17, wherein the air handling system is configured to direct the vaporized working fluid to a high-pressure chamber.

19. The two-phase immersion cooling system of claim 18, wherein the supplemental condenser is located in the high-pressure chamber.

20. The two-phase immersion cooling system of claim 19, wherein the high-pressure chamber includes a trap to capture the working fluid vapor.

* * * * *